United States Patent
Yoshida

(10) Patent No.: US 8,745,454 B2
(45) Date of Patent: Jun. 3, 2014

(54) SEMICONDUCTOR DEVICE HAVING TEST MODE AND METHOD OF CONTROLLING THE SAME

(76) Inventor: Hiroyasu Yoshida, Tokyo (JP)

(*) Notice: Subject to any disclaimer, the term of this patent is extended or adjusted under 35 U.S.C. 154(b) by 7 days.

(21) Appl. No.: 13/292,834

(22) Filed: Nov. 9, 2011

(65) Prior Publication Data

US 2012/0131397 A1 May 24, 2012

(30) Foreign Application Priority Data

Nov. 18, 2010 (JP) .................... 2010-257774

(51) Int. Cl.
  *G01R 31/28* (2006.01)
(52) U.S. Cl.
  USPC .......................................... 714/724
(58) Field of Classification Search
  CPC .. G06F 11/1441; G06F 11/30; G06F 11/0793
  USPC ......................... 714/724, 718, 726
  See application file for complete search history.

(56) References Cited

U.S. PATENT DOCUMENTS

| | | | | |
|---|---|---|---|---|
| 6,459,635 | B1* | 10/2002 | Mullarkey et al. | 365/201 |
| 6,762,617 | B2* | 7/2004 | Iwase et al. | 326/11 |
| 7,529,143 | B2* | 5/2009 | Sakuragi | 365/200 |
| 2003/0145184 | A1* | 7/2003 | Sato et al. | 711/167 |
| 2007/0268776 | A1* | 11/2007 | Matsubara | 365/233 |
| 2009/0016120 | A1* | 1/2009 | Kinoshita et al. | 365/189.05 |
| 2009/0040850 | A1* | 2/2009 | Mori et al. | 365/201 |
| 2009/0284290 | A1* | 11/2009 | Kuroki et al. | 327/158 |

FOREIGN PATENT DOCUMENTS

| | | |
|---|---|---|
| JP | 06-243676 A | 9/1994 |
| JP | 2000-243098 A | 9/2004 |
| JP | 2007-323723 (A) | 12/2007 |

* cited by examiner

*Primary Examiner* — Esaw Abraham
*Assistant Examiner* — Osman Alshack
(74) *Attorney, Agent, or Firm* — Foley & Lardner LLP

(57) ABSTRACT

When an update disable signal is at an inactivation level, a latch signal is activated in accordance with an active signal and a mode register set signal. When the update disable signal is at an activation level, the latch signal is activated in accordance with the active signal while being not activated in accordance with the mode register set signal. Based on the latch signal, the address signal is latched. Based on the latched address signal, an internal test signal is generated. With this structure, a target chip can be selectively controlled simply by activating the update disable signal in the target chip.

3 Claims, 7 Drawing Sheets

SEMICONDUCTOR DEVICE HAVING TEST MODE AND METHOD OF CONTROLLING THE SAME

BACKGROUND OF THE INVENTION

1. Field of the Invention

The present invention relates to a semiconductor device and a method of controlling the semiconductor device, and more particularly, to a semiconductor device having a test mode and a method of controlling the semiconductor device having the test mode.

2. Description of Related Art

A plurality of semiconductor memory devices such as DRAMs (Dynamic Random Access Memories) are often used in the state of being mounted on a module substrate. Therefore, in the stages of the development of semiconductor memories, there is the need to perform an operation test on semiconductor memory devices in the state of being mounted on a module substrate, and perform timing adjustment and the like in accordance with the test results. However, in the stages of semiconductor memory development, the number of semiconductor chips that can be subjected to the evaluation tests do not exist in large, and therefore, it is difficult to mount only semiconductor memory devices under development on a module substrate. In view of this, there has been a conventionally utilized method by which only one semiconductor memory device under development is mounted on a module substrate on which semiconductor memory devices already mass-produced are mounted, and this one semiconductor memory device is accessed.

On the module substrate, however, address terminals and command terminals are commonly connected among the respective semiconductor memory devices. Therefore, it is not possible to enter only a specific chip into a test mode. As a result, when the target chip enters the test mode, all the other chips also enter the test mode, and the chips cannot be adjusted independently of one another. Also, in a case where different test codes are used between mass-produced chips and chips under development, a chip that is not a target chip may enter an unintended test mode.

Japanese Patent Application Laid-Open No. 2007-323723 discloses a method of accessing semiconductor memory devices on a module substrate independently of one another.

A semiconductor device disclosed in Japanese Patent Application Laid-Open No. 2007-323723 is capable of accessing respective chips independently of one another by using defective addresses replaced with redundant cells as the IDs of the respective chips. The excellent feature of this method is that not only a specific chip on a module substrate can be accessed independently of the other chips, but also the other chips can be accessed independently of one another. By the method disclosed in Japanese Patent Application Laid-Open No. 2007-323723, on the other hand, after a defective address is read by using a roll-call circuit, the read defective address needs to be analyzed. Therefore, the procedures are somewhat complicated. In view of this, the method is not necessarily an optimum method to be used in a case where only one semiconductor memory device under development is mounted on a module substrate on which mass-produced semiconductor memory devices are mounted, and only the semiconductor memory device under development is put into the test mode, as described above.

SUMMARY

In one embodiment, there is provided a semiconductor device that includes: a latch control circuit that activates a latch signal in response to at least one of first and second command signals when an update disable signal is in a first logic level, and activates the latch signal in response to the first command signal without activating the latch signal in response to the second command signal when the update disable signal is in a second logic level different from the first logic level; a latch circuit that latches an address signal in response to the latch signal; and a test circuit unit that generates a first internal test signal based on the address signal latched by the latch circuit.

In another embodiment, there is provided a semiconductor device that includes: a module substrate; and a plurality of semiconductor chips mounted on the module substrate, each of the semiconductor chips including an address terminal and a command terminal, the address terminal of at least one of the semiconductor chips being commonly connected to respective address terminals of the other of the semiconductor chips on the module substrate, the command terminal of the at least one of the semiconductor chips being commonly connected to respective command terminals of the other of the semiconductor chips on the module substrate, wherein the at least one of the semiconductor chips includes: a latch control circuit that activates a latch signal in response to at least one of first and second command signals supplied via the command terminal when an update disable signal is in a first logic level, and activates the latch signal in response to the first command signal without activating the latch signal in response to the second command signal when the update disable signal is in a second logic level different from the first logic level; a latch circuit that latches an address signal supplied via the address terminal in response to the latch signal; and a test circuit unit that generates a first internal test signal based on the address signal latched by the latch circuit.

In one embodiment, there is provided a method of controlling a semiconductor device that includes: supplying a mode register set command and a first test code to activate a first internal test signal, when the first internal test signal is activated, an update of a test code stored in a latch circuit based on the mode register set command issued thereafter is invalidated; supplying an active command and a second test code after activating the first internal test signal to store the second test code in the latch circuit; and supplying the mode register set command again when the latch circuit latches the second test code to generate a second internal test signal based on the second test code.

DETAILED DESCRIPTION OF THE EMBODIMENTS

Preferred embodiments of the present invention will be explained below in detail with reference to the accompanying drawings.

Figure 1:
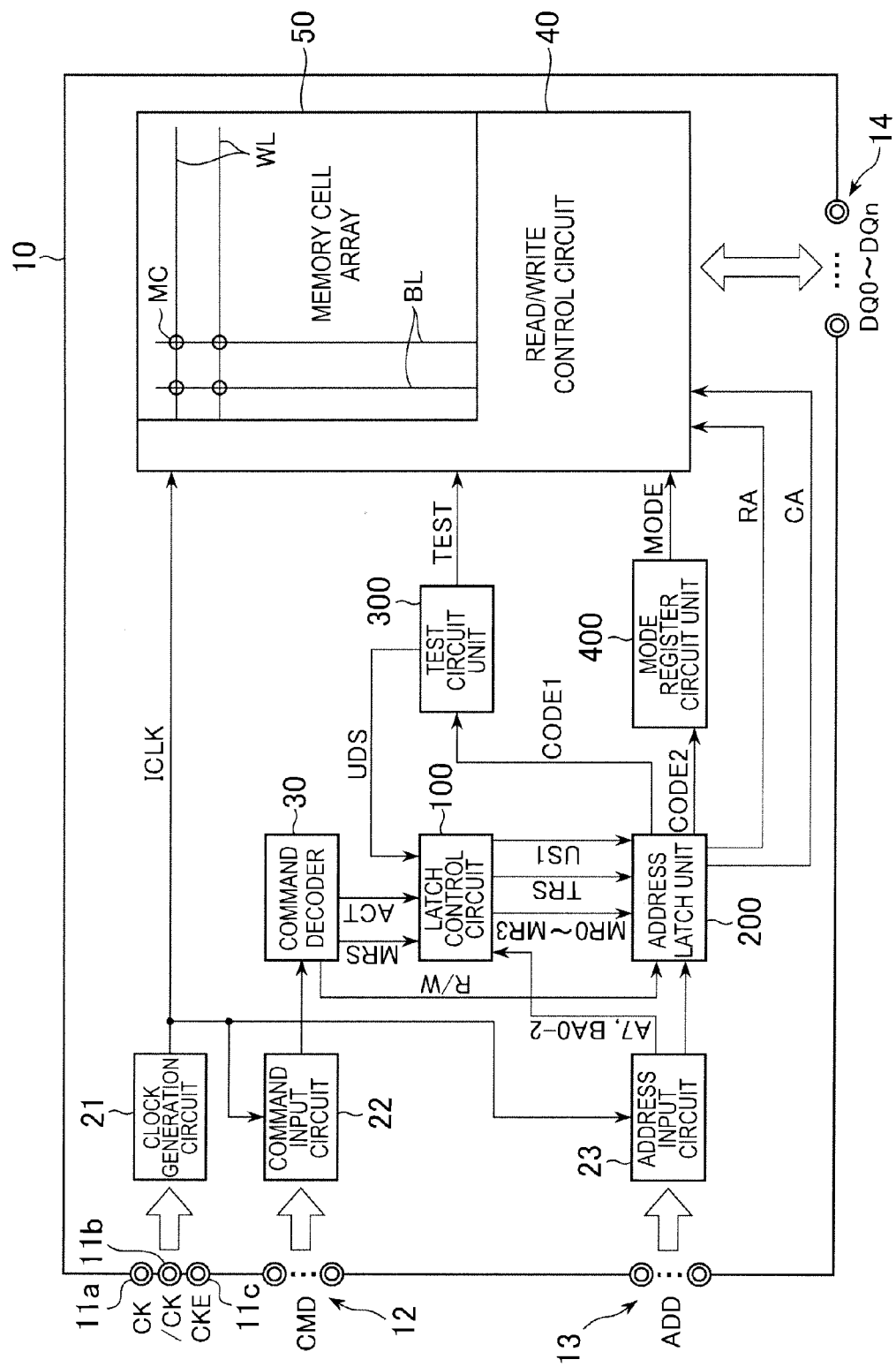
FIG. 1 is a block diagram indicative of a structure of a semiconductor device 10 according to a preferred embodiment of the present invention.

Referring now to FIG. 1, the semiconductor device 10 according to this embodiment includes plural external terminals including clock terminals 11a and 11b, a clock enable terminal 11c, a command terminal 12, an address terminal 13, and a data input/output terminal 14. Other than those, a power supply terminal and a data strobe terminal and the like are also included in the semiconductor device 10, but are not shown in the drawing.

The clock terminals 11a and 11b are supplied with external clock signals CK and /CK complementary to each other. The clock enable terminal 11c supplied with a clock enable signal CKE. In this specification, those terminals 11a to 11c may be collectively referred to simply as "clock terminals 11". The external clock signals CK and /CK, and the clock enable signal CKE, which are input to the clock terminals 11, are supplied to a clock generation circuit 21. The clock generation circuit 21 generates an internal clock signal ICLK based on the external clock signals CK and /CK, and the clock enable signal CKE. The generated internal clock signal ICLK is supplied to respective circuit blocks.

The command terminal 12 is supplied with respective command signals CMD such as an active command, a read command, a write command, a precharge command, and a mode register set command. The active command is issued at the time of a row access, the read command and the write command are issued at the time of a column access, and the mode register set command is issued at the time of mode setting.

Those command signals CMD are expressed by combinations of signals such as a row address strobe signal, a column address strobe signal and the like. The command signals CMD input to the command terminal 12 are supplied to a command decoder 30 via a command input circuit 22. The command decoder 30 decodes the input command signals CMD, and, based on the results, activates respective internal command signals. Specifically, when the active command is issued, the command decoder 30 activates an active signal ACT. When the read command or the write command is issued, the command decoder 30 activates a read/write signal R/W. When the mode register set command is issued, the command decoder 30 activates a mode register set signal MRS.

The address terminal 13 is supplied with an address signal ADD. The address signal ADD input to the address terminal 13 is supplied to a latch control circuit 100 and an address latch unit 200 via an address input circuit 23. The active signal ACT and the mode register set signal MRS output from the command decoder 30 are also supplied to the latch control circuit 100. The read/write signal R/W output from the command decoder 30 is also supplied to the address latch unit 200. The latch control circuit 100 and the address latch unit 200 will be described later in detail.

Among the address signal ADD latched by the address latch unit 200, a row address RA and a column address CA are supplied to a read/write control circuit 40. The read/write control circuit 40 performs reading operations and writing operations on a memory cell array 50. Read data DQ0 to DQn read from the memory cell array 50 via the read/write control circuit 40 are output to the outside via the data input/output terminal 14, and write data DQ0 to DQn input from the outside via the data input/output terminal 14 are written into the memory cell array 50 via the read/write control circuit 40.

The memory cell array 50 includes word lines WL and bit lines BL, and memory cells MC that are placed at the respective intersection points of the word lines WL and the bit lines BL. Selection of a word line WL (a row access) is performed based on the row address RA, and selection of a bit line BL (a column access) is performed based on the column address CA.

The semiconductor device 10 according to this embodiment further includes a test circuit unit 300 and a mode register circuit unit 400. The test circuit unit 300 receives a code setting address CODE1 output from the address latch unit 200, and, based on the code setting address CODE1, activates various types of internal test signals TEST. The internal test signals TEST are supplied to the read/write control circuit 40, and the read/write control circuit 40 in turn performs test operations in accordance with the internal test signals TEST. The test operations include timing adjustment and voltage level adjustment. The test circuit unit 300 further generates an update disable signal UDS, and supplies the update disable signal UDS to the latch control circuit 100. The test circuit unit 300 will be described later in detail.

The mode register circuit unit 400 receives a code setting address CODE2 output from the address latch unit 200, and, based on the code setting address CODE2, activates various types of internal mode signals MODE. The internal mode signals MODE are supplied to the read/write control circuit 40, and the read/write control circuit 40 in turn performs operations in respective modes in accordance with the internal mode signals MODE. The operation mode settings include latency setting and burst length setting.

Figure 2:
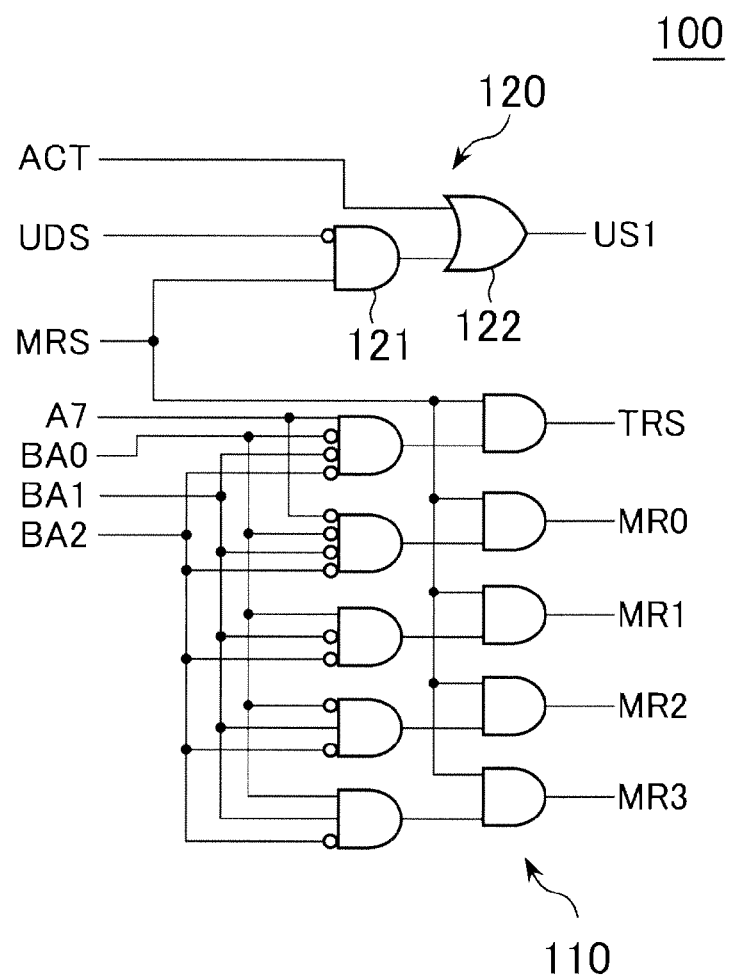
FIG. 2 is a circuit diagram indicative of a latch control circuit 100 shown in FIG. 1.

Turning to FIG. 2, the latch control circuit 100 includes: a logic circuit 110 that generates a test enable signal TRS and mode register select signals MR0 to MR3 based on the mode register set signal MRS and the bits A7 and BA0 to BA2 of the address signal ADD; and a logic circuit 120 that generates a latch signal US1 based on the mode register set signal MRS, the update disable signal UDS, and the active signal ACT.

The logic circuit 110 is a decoder, and, under the condition that the mode register set signal MRS is activated to a high level, the logic circuit 110 activates the test enable signal TRS and one of the mode register select signals MR0 to MR3 based on the bits A7 and BA0 to BA2 of the address signal ADD.

The logic circuit 120 includes an AND gate circuit 121 and an OR gate circuit 122. The mode register set signal MRS is input to one of the input nodes of the AND gate circuit 121, and an inverted signal of the update disable signal UDS is input to the other of the input nodes. The output of the AND gate circuit 121 is supplied to one of the input nodes of the OR gate circuit 122, and the active signal ACT is supplied to the other of the input nodes. With this structure, when the active signal ACT is activated to the high level, the latch signal US1 is activated unconditionally, and, when the mode register set signal MRS is activated to the high level, the latch signal US1 is activated under the condition that the update disable signal UDS is at a low level. In other words, even when the mode register set signal MRS is activated to the high level, activation of the latch signal US1 is prohibited if the update disable signal UDS is at the high level.

As shown in FIG. 1, those signals generated by the latch control circuit 100 are supplied to the address latch unit 200.

Figure 3:
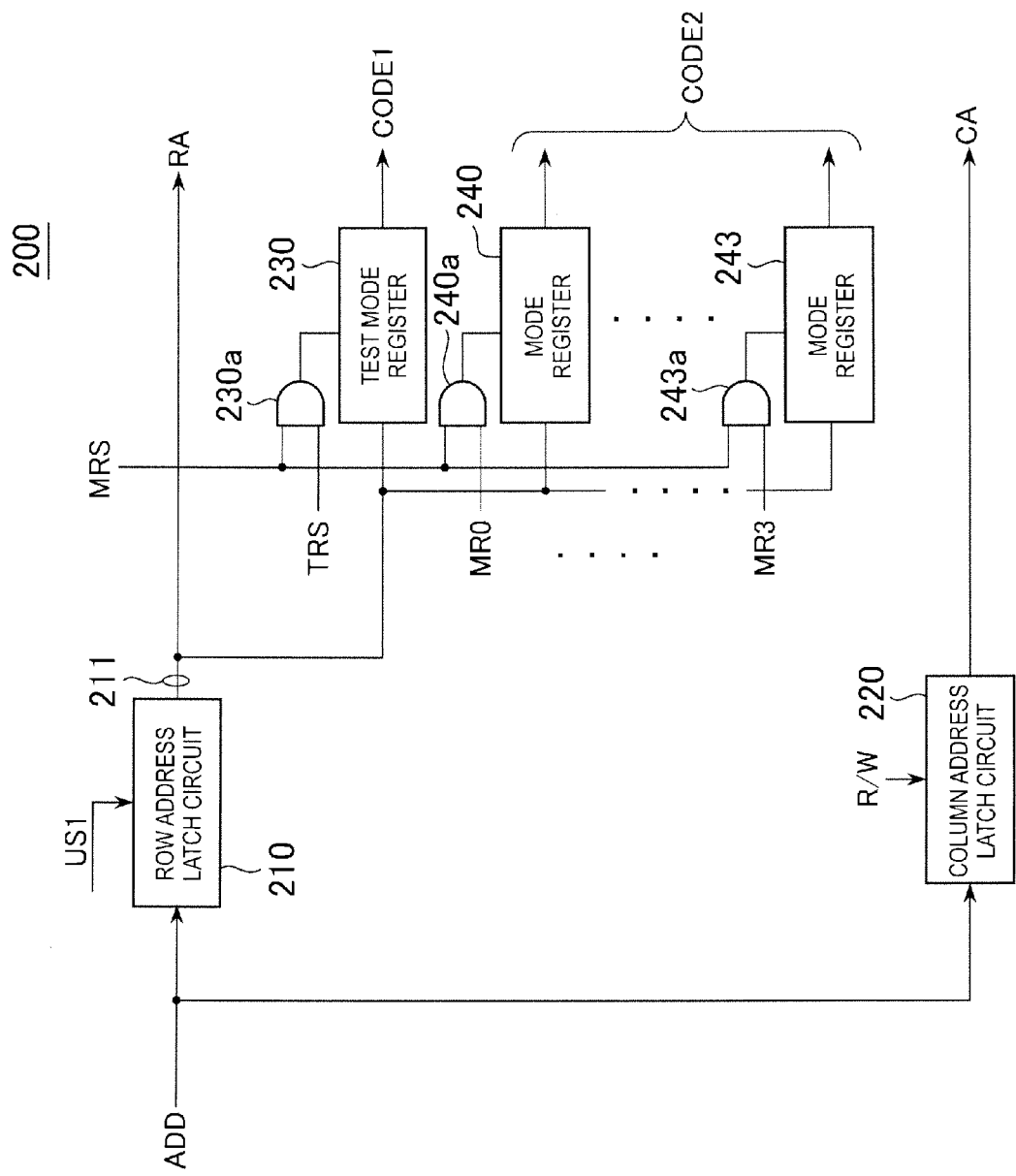
FIG. 3 is a circuit diagram indicative of an address latch unit 200 shown in FIG. 1.

Turning to FIG. 3, the address latch unit 200 includes: a row address latch circuit 210 and a column address latch circuit 220 that latch the address signal ADD supplied via the address input circuit 23; and a test mode register 230 and mode registers 240 to 243 that receive the output of the row address latch circuit 210.

The row address latch circuit 210 is a circuit that latches the address signal ADD supplied via the address input circuit 23 in synchronization with the latch signal US1. The address signal ADD latched by the row address latch circuit 210 is output to a row address bus 211. The row address bus 211 is connected to the read/write control circuit 40, and is also connected to the test mode register 230 and the mode registers 240 to 243. Therefore, the row address latch circuit 210 is a latch circuit for row addresses, and is also a latch circuit for the test mode register 230 and the mode registers 240 to 243.

When both the test enable signal TRS and the mode register set signal MRS are at the high level, the test mode register 230 is activated by an AND gate circuit 230a, and is overwritten by part of the address signal ADD on the row address bus 211. The value set in the test mode register 230 is output as the code setting address CODE1, and is input to the test circuit unit 300.

Likewise, when both the mode register select signals MR0 to MR3 and the mode register set signal MRS are at the high level, the mode registers 240 to 243 are activated by AND gate circuits 240a to 243a respectively, and are overwritten by part of the address signal ADD on the row address bus 211. The values set in the mode registers 240 to 243 are output as the code setting address CODE2, and are input to the mode register circuit unit 400.

Figure 4:
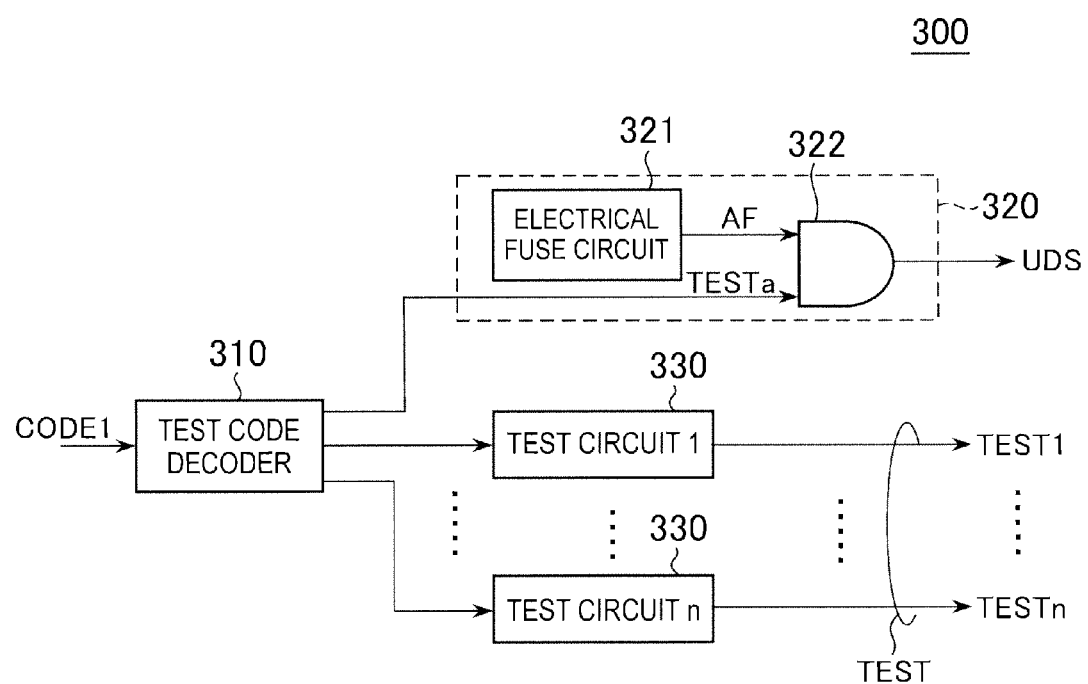
FIG. 4 is a circuit diagram indicative of a test circuit unit 300 shown in FIG. 1.

Turning to FIG. 4, the test circuit unit 300 includes a test code decoder 310 that decodes the code setting address CODE1, and test circuits 320 and 330 that receive the output of the test code decoder 310. The test circuit 320 is a circuit that generates the update disable signal UDS, and includes an AND gate circuit 322 that receives an internal test signal AF output from an electrical fuse circuit 321 and an internal test signal TESTa output from the test code decoder 310.

The electrical fuse circuit 321 is a nonvolatile storage element on which writing can be electrically performed, and may be an anti-fuse element, for example. An anti-fuse element is insulated in an unprogrammed state. When a high voltage is applied, such an anti-fuse element becomes conductive by breakdown, and is put into a programmed state. Once an anti-fuse element is put into a programmed state, the anti-fuse element cannot be put back into an unprogrammed state. Accordingly, nonvolatile and irreversible storing can be performed. The internal test signal AF that is the output of the electrical fuse circuit 321 shown in FIG. 4 is at the low level in an unprogrammed state, and is at the high level in a programmed state.

Figure 5:
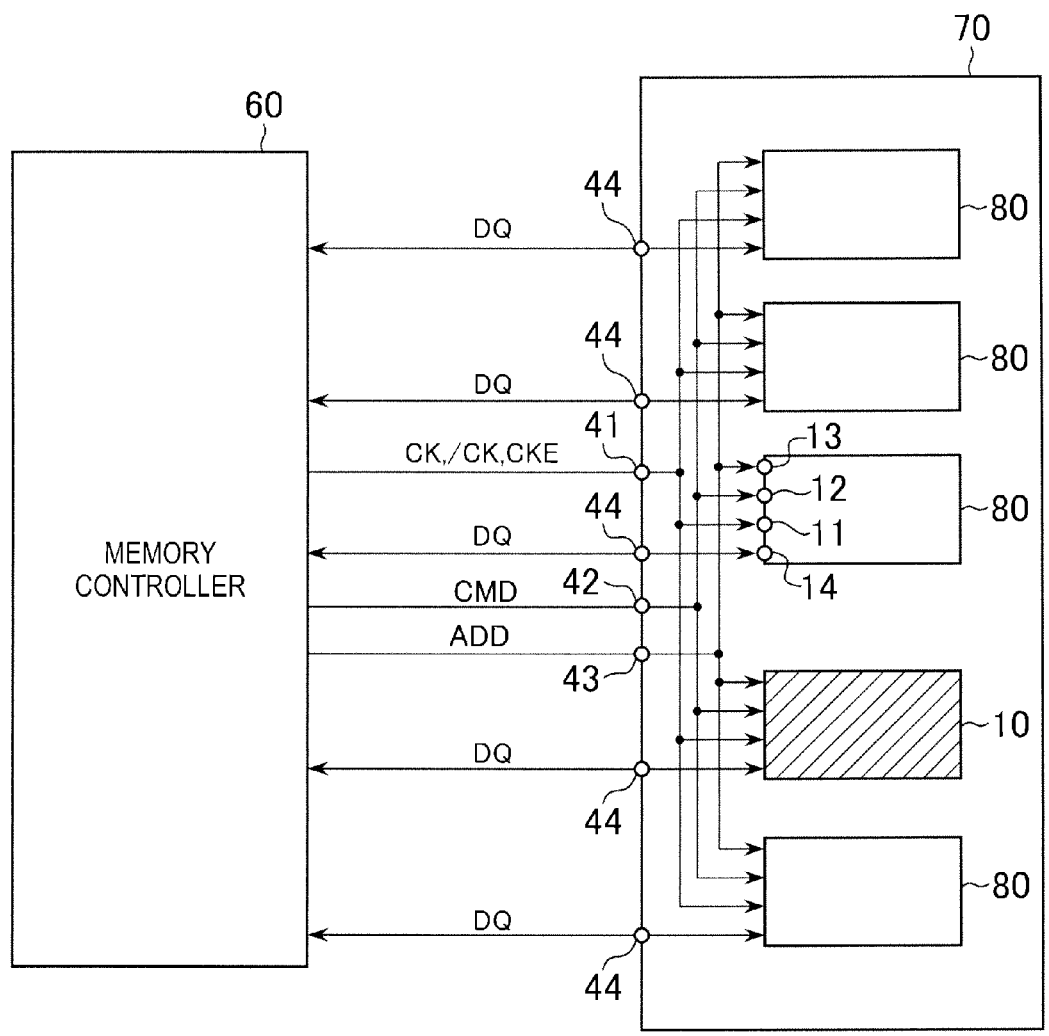
FIG. 5 is a schematic view indicative of a situation where the semiconductor device 10 according to the preferred embodiment is mounted on a module substrate.

Turning to FIG. 5, in the example illustrated in this FIG. 5, semiconductor chips 80 are mounted on a module substrate 70, and only one of the semiconductor chips 80 is replaced with the semiconductor device 10 according to this embodiment. In a case where semiconductor devices 10 are under development, it is difficult to replace all the semiconductor chips mounted on the module substrate 70 with the semiconductor devices 10 under development. Therefore, memory modules using the semiconductor chips 80 that have already been mass-produced are used instead, and only one of the chips is replaced with the semiconductor device 10 under development. With this arrangement, a test can be performed on the semiconductor device 10 mounted on the module substrate 70, even if semiconductor devices 10 to be evaluated are not available in large numbers.

On the module substrate 70, the clock terminals 11 of the respective chips are commonly connected, the command terminals 12 of the respective chips are commonly connected, and the address terminals 13 of the respective chips are commonly connected. That is, a clock substrate terminal 41, a command substrate terminal 42, and an address substrate terminal 43 are formed on the module substrate 70, and the clock terminals 11, the command terminals 12, and the address terminals 13 formed on the respective chips are commonly connected to the clock substrate terminal 41, the command substrate terminal 42, and the address substrate terminal 43, respectively. Therefore, the clock signals CK, /CK, and CKE, the command signals CMD, and the address signal ADD supplied from a memory controller 60 are commonly supplied to all the chips 10 and 80 on the module substrate 70. On the other hand, the data input/output terminals 14 are connected, independently of one another, to respective data input/output substrate terminals 44 on the module substrate 70.

Figure 6:
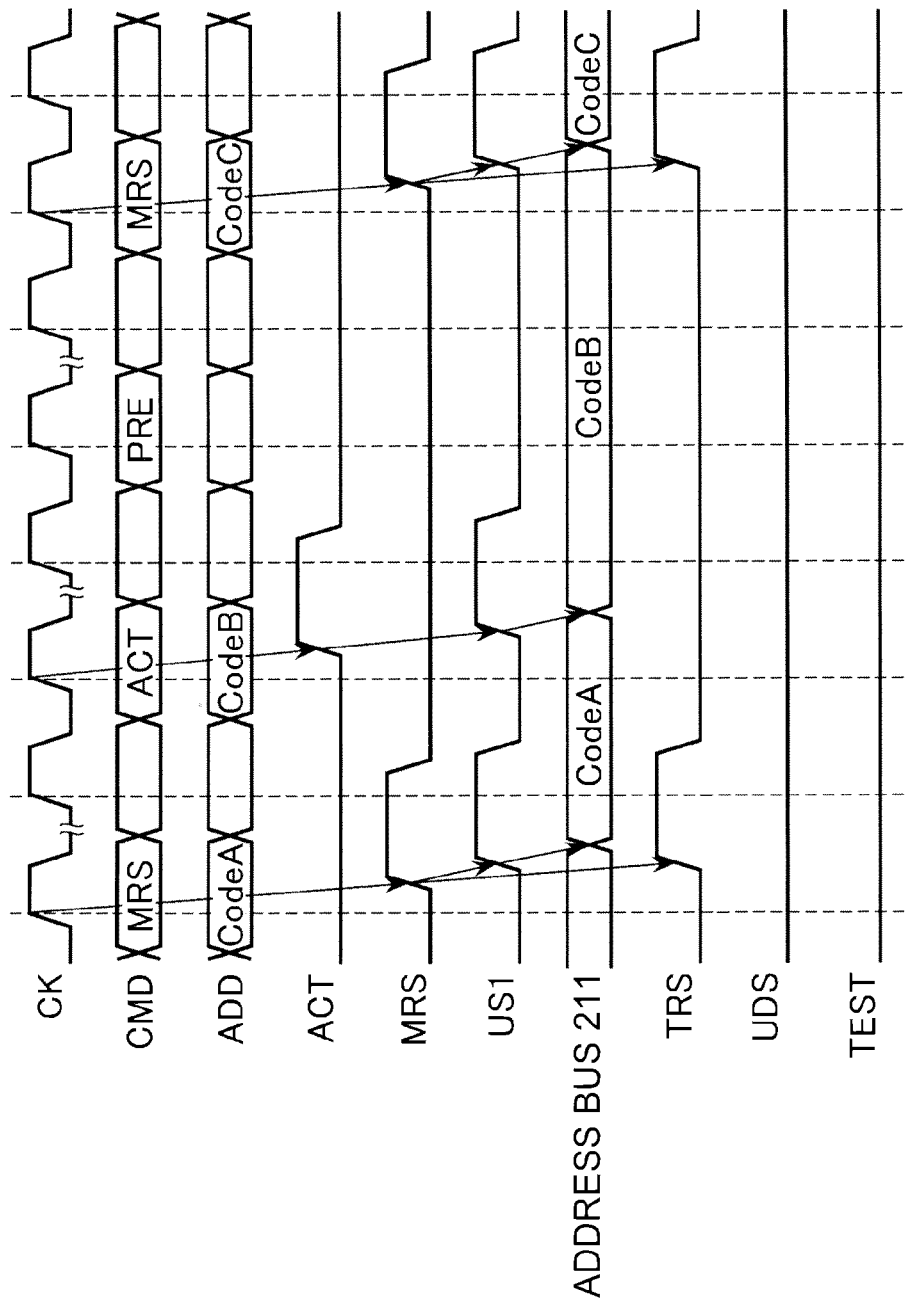
FIG. 6 is a timing chart for explaining an operation of the semiconductor device 10 according to the preferred embodiment, and indicative of an operation to be performed where an electrical fuse circuit 321 is in an unprogrammed state.

Turning to FIG. 6, in a case where the electrical fuse circuit 321 is in an unprogrammed state, the internal test signal AF is fixed at the low level. Therefore, even when the internal test signal TESTa is activated, the update disable signal UDS remains at the low level. Therefore, even when either the active signal ACT or the mode register set signal MRS is activated to the high level, the logic circuit 120 shown in FIG. 2 activates the latch signal US1.

In the example illustrated in FIG. 6, a first mode register set command, an active command, a precharge command, and a second mode register set command are issued in this order in synchronization with the external clock signal CK. In response to the respective commands, the command decoder 30 shown in FIG. 1 activates the corresponding active signal ACT, the corresponding mode register set signal MRS, and the like. As described above, the electrical fuse circuit 321 is in an unprogrammed state in this example. Therefore, the latch signal US1 is activated every time when either the active signal ACT or the mode register set signal MRS is activated. Accordingly, the address signal ADD that is input in synchronization with an active command or a mode register set command is supplied to the address bus 211 in either way. In the example illustrated in FIG. 6, a test code CodeA is input from the address terminal 13 in synchronization with the first mode register set command, a test code CodeB is input from the address terminal 13 in synchronization with the active command, and a test code CodeC is input from the address terminal 13 in synchronization with the second mode register set command.

Both the test code CodeA and the test code CodeC are signals for activating the test enable signal TRS. Therefore, when the first mode register set command is issued, the test mode register 230 is overwritten with the value contained in the test code CodeA, and the corresponding code setting address CODE1 is generated. Likewise, when the second mode register set command is issued, the test mode register 230 is overwritten with the value contained in the test code CodeC, and the corresponding code setting address CODE1 is generated.

The above described operation is an operation to be performed in a case where the electrical fuse circuit 321 is in an unprogrammed state, and is also an operation to be performed by each of the other semiconductor chips 80 different from the semiconductor device 10 according to this embodiment. Therefore, when the electrical fuse circuit 321 in the semiconductor device 10 is in a programmed state, the above described operation is performed by all the chips 80 other than the semiconductor device 10 according to this embodiment among the chips 10 and 80 mounted on the module substrate 70. In this case, an operation (described below) different from the above is performed by the semiconductor device 10. Since all the chips 80 other than the semiconductor device 10 are not to be evaluated, there is no need for those chips 80 to perform any test operation. Accordingly, if the test code CodeA is set as the code for entering the test mode, and the test code CodeC is set as the code for canceling the test mode, for example, the other chips 80 actually do not perform any test operation. Alternatively, the test code CodeC may be set as an invalid test code. In this case, the other chips 80 actually do not perform any test operation.

Figure 7:
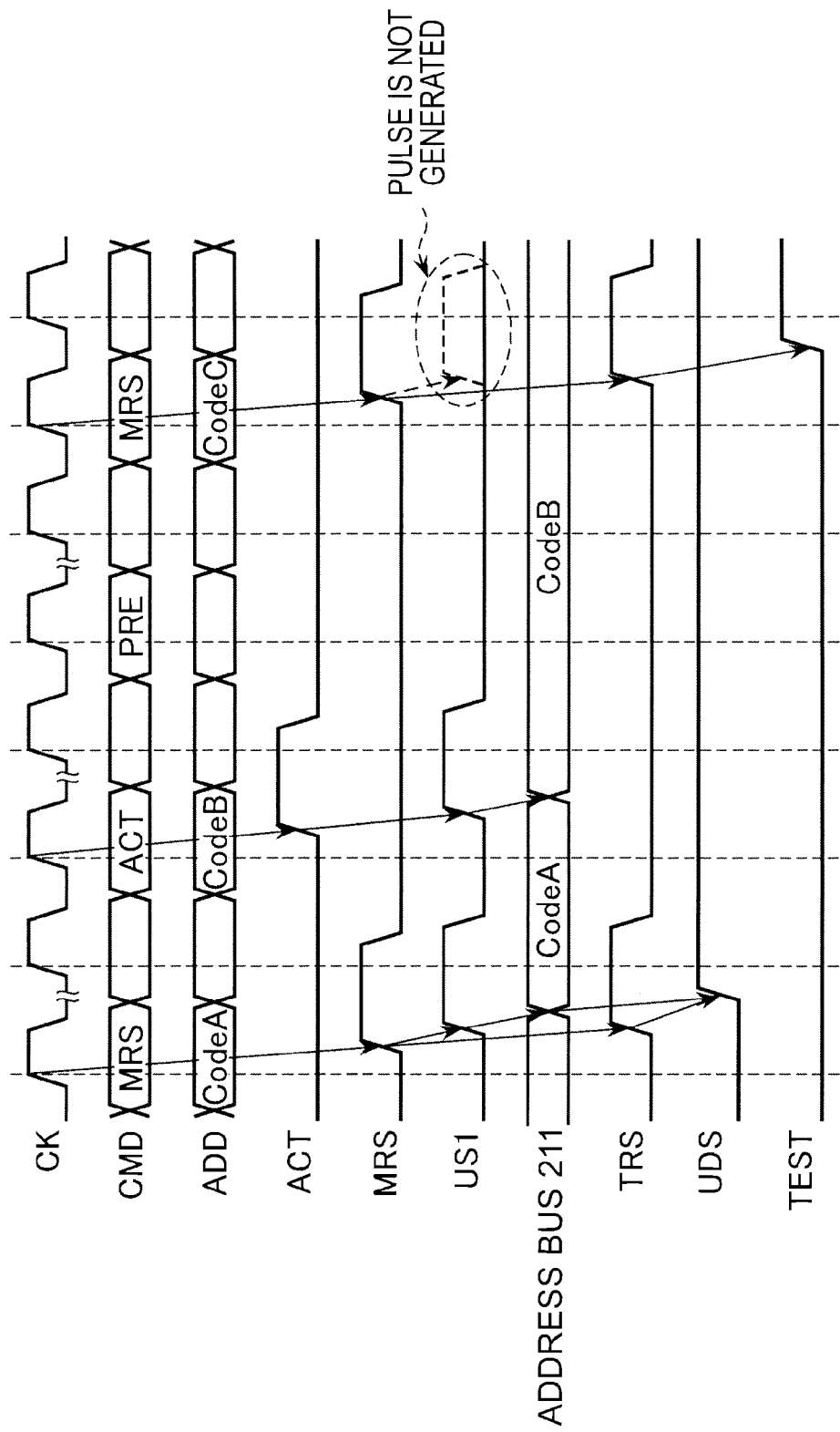
FIG. 7 is a timing chart for explaining an operation of the semiconductor device 10 according to the preferred embodiment, and indicative of an operation to be performed where the electrical fuse circuit 321 is in a programmed state.

Turning to FIG. 7, in a case where the electrical fuse circuit 321 is in a programmed state, the internal test signal AF is fixed at the high level. Therefore, when the internal test signal TESTa is activated, the update disable signal UDS is switched to the high level. Therefore, even if a mode register set command is issued while the update disable signal UDS is switched to the high level, the latch signal US1 is not activated.

In the example illustrated in FIG. 7, a first mode register set command, an active command, a precharge command, and a second mode register set command are also issued in this order in synchronization with the external clock signal CK. In response to the respective commands, the command decoder 30 activates the corresponding active signal ACT, the corresponding mode register set signal MRS, and the like. However, the electrical fuse circuit 321 is in a programmed state in this example. Therefore, if the mode register set signal MRS is activated while the update disable signal UDS is switched to the high level, the latch signal US1 is not activated.

Specifically, when the first mode register set command is issued, the update disable signal UDS is still at the low level. Therefore, the test code CodeA is properly latched by the address latch circuit 210, and is output to the address bus 211. The test mode register 230 is then overwritten with the value contained in the test code CodeA, and the corresponding code setting address CODE1 is generated. The generated code setting address CODE1 has contents to activate the internal test signal TESTa, and thereby the update disable signal UDS is switched to the high level.

When the test code CodeB is input in synchronization with the active command, the test code CodeB is latched by the address latch circuit 210, and is output to the address bus 211.

After that, when the test code CodeC is input in synchronization with the second mode register set command, the update disable signal UDS is at the high level. Therefore, the address latch circuit 210 does not latch the test code CodeC, and the previous test code CodeB remains held on the address bus 211. The test mode register 230 is then overwritten with the value contained in the test code CodeB, and the corresponding code setting address CODE1 is generated. The generated code setting address CODE1 has contents to activate one of internal test signals TEST1 to TESTn, and thereby the read/write control circuit 40 performs a predetermined test operation. Meanwhile, the chips each having the electrical fuse circuit 321 in an unprogrammed state, or the other chips 80, actually do not perform any test operation, as shown in FIG. 6.

As described above, even when the same command and the same test code are issued from the memory controller 60, different operations can be performed depending on whether the electrical fuse circuit 321 is in a programmed state. In reality, a signal equivalent to the update disable signal UDS does not exist in semiconductor chips that have already been mass-produced. Therefore, the operation illustrated in FIG. 6 is invariably performed in the semiconductor chips that have already been mass-produced. On the other hand, when the electrical fuse circuit 321 is programmed in the semiconductor device 10 under development, the operation illustrated in FIG. 7 can be performed. Even if the electrical fuse circuit 321 is programmed, the update disable signal UDS is not generated unless the internal test signal TESTa is activated. Therefore, the semiconductor device 10 having the electrical fuse circuit 321 in a programmed state is capable of performing regular operations in practical use.

As described so far, according to this embodiment, a test operation can be performed selectively on a specific chip even in a case where the same command signal CMD and the same address signal ADD are supplied to chips mounted on a module substrate. Therefore, in the state that a semiconductor device under development is mounted on a module substrate, the semiconductor device under development can be easily evaluated.

It is apparent that the present invention is not limited to the above embodiments, but may be modified and changed without departing from the scope and spirit of the invention.

For example, in the above described embodiment, the internal test signal AF is generated with the use of an electrical fuse circuit. Instead of the electrical fuse circuit, a signal that is generated from a fuse element indicating the ID of the chip may be used. Also, an optical fuse that can be cut with a laser beam may be used.

In addition, while not specifically claimed in the claim section, the applicant reserves the right to include in the claim section of the application at any appropriate time the following methods:

A1. A method of controlling a semiconductor device, comprising:
supplying a mode register set command and a first test code to activate a first internal test signal, when the first internal test signal is activated, an update of a test code stored in a latch circuit based on the mode register set command issued thereafter is invalidated;
supplying an active command and a second test code after activating the first internal test signal to store the second test code in the latch circuit; and
supplying the mode register set command again when the latch circuit latches the second test code to generate a second internal test signal based on the second test code.

A2. The method as described in A2, further comprising supplying the mode register set command and a third test code when the latch circuit latches the second test code.

A3. The method as described in A2, wherein the third test code is used to cancel a test mode that is entered based on the first test code.

A4. The method as described in A2, wherein the third test code is an invalid test code.

What is claimed is:
1. A device comprising:
a latch control circuit including first, second and third input nodes, the first and second input nodes receiving first and second commands, respectively, the latch control circuit being configured to produce a latch signal in response to each of the first and second commands when the third input node is at a first logic level, the latch control circuit being configured to produce the latch signal in response to the first command when the third input node is at a second logic level and not to produce the latch signal in response to the second command when the third input node is at the second logic level;
a latch circuit configured to capture address information in response to the latch signal;
a first circuit unit including a plurality of fourth input nodes receiving the address information from the latch circuit and first and second output nodes, the first output node being coupled to the third input node of the latch control circuit, the first circuit unit being configured to respond the address information to produce an update disable signal, that changes between the first and second logic levels, at the first output node thereof so as to drive the third input node of the latch control circuit, and produce an operation signal at the second output node thereof; and an internal circuit configured to operate in response to the operation signal.

2. The device as claimed in claim 1, wherein the first circuit unit further includes a first decoder circuit receiving the address information and generating a plurality of internal signals, that includes a first internal signal, in response to the address information, a fuse circuit including a fuse element and configured to output a fuse output signal, and a logic circuit receiving the first internal signal and the fuse output signal and configured to perform a logic operation on the first internal signal and the fuse output signal so as to produce the update disable signal.

3. The device as claimed in claim 2, wherein the first decoder circuit configured to activate the first internal signal without activation of the rest of the internal signals when the address information indicates a first code.

* * * * *